United States Patent
Burdick, Jr. et al.

(10) Patent No.: US 6,933,813 B2
(45) Date of Patent: Aug. 23, 2005

(54) INTERCONNECTION STRUCTURE WITH ETCH STOP

(75) Inventors: William Edward Burdick, Jr., Niskayuna, NY (US); James Wilson Rose, Guilderland, NY (US); Kevin Matthew Durocher, Waterford, NY (US); Raymond Albert Fillion, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/714,376

(22) Filed: Nov. 12, 2003

(65) Prior Publication Data

US 2004/0099947 A1 May 27, 2004

Related U.S. Application Data

(62) Division of application No. 09/681,066, filed on Dec. 18, 2000, now Pat. No. 6,671,948.

(51) Int. Cl.⁷ ............................................... H05K 3/38
(52) U.S. Cl. ...................... 333/247; 257/664; 257/728
(58) Field of Search .................. 333/33, 247; 257/664, 257/728

(56) References Cited

U.S. PATENT DOCUMENTS

| | | |
|---|---|---|
| 4,374,394 A | 2/1983 | Camisa |
| 5,151,776 A | 9/1992 | Wojnarowski et al. |
| 5,355,102 A | 10/1994 | Kornrumpf et al. .......... 333/33 |
| 5,527,741 A | 6/1996 | Cole et al. |
| 5,635,762 A | 6/1997 | Gamand ................. 333/246 X |

*Primary Examiner*—Benny Lee
(74) *Attorney, Agent, or Firm*—Ann M. Agosti; Patrick K. Patnode

(57) ABSTRACT

An interconnection structure includes: a dielectric layer; a first metallization pattern on the dielectric layer, the first metallization pattern including at least one etch stop having a perimeter defining at least one etch stop opening; a cured adhesive on a portion of the dielectric layer, the adhesive not present in an area aligned with the at least one etch stop; and at least one electrical device being attached to the dielectric layer by the adhesive such that an active area of the at least one electrical device is aligned with the etch stop perimeter. The active area of the at least one electrical device may further be aligned with at least one predetermined area defined by an optional additional portion of cured adhesive, the additional portion of the cured adhesive being adhesively attached to the dielectric layer and not adhesively attached to the at least one electrical device.

4 Claims, 6 Drawing Sheets

INTERCONNECTION STRUCTURE WITH ETCH STOP

This application is a divisional of application Ser. No. 09/681,066 filed Dec. 18, 2000 now U.S. Pat. No. 6,671,948.

BACKGROUND OF INVENTION

The invention relates generally to electrical device packaging and more to packaging of electrical devices requiring energy transmission to and/or from device active areas.

As the need for smaller, lighter, portable and/or mobile equipment increases in applications such as medical imaging, consumer electronics, and communication devices, the need for high density device and system level packaging likewise increases. High density packages would be most beneficial if adapted for interconnecting hundreds of input and output pads and providing an unobstructed path for transmission and/or absorption of energy directed to and/or from the active area of a packaged device.

For example, ultrasound imaging equipment uses active areas of electrical devices to transmit and receive hundreds of acoustic signals which can be used to create images of patient anatomy. The active areas of these devices must be substantially free of material that would attenuate or distort the signals. Accordingly, ideal packaging technology would be capable of interconnecting high pin count acoustic devices with fine pitched (less than 0.2 millimeter, for example) input/output pads and providing an open window over the active area of each packaged device. Preferably, such an open window would offer protection from damage to the device active area during the packaging process.

Cole et al., U.S. Pat. No. 5,527,741, issued 18 Jun. 1996, describes a method for fabricating a circuit module by forming a flexible interconnect layer of multiple layers of metallized polymer film, attaching a circuit chip to the film with an adhesive, forming vias through the flexible interconnect layer, and applying metallization to couple chip pads through the vias. Such flex-based packaging has been useful for high pin count devices with fine pitch but has resulted in embodiments wherein the entire active area of the device is covered by the flexible interconnect layer. Thus such packaging has been limited with respect to optical or acoustic sensors that cannot operate efficiently when covered by material which attenuates or distorts energy transmission.

As described in Kornrumpf et al., U.S. Pat. No. 5,355,102, issued 11 Oct. 1994, ablating dielectric material over the center of a device may adversely affect the device. To protect microwave devices, Kornrumpf et al. recommended placing a small piece of polytetrafluoroethylene or other non-laser ablatable material on top of the active area of the device to cover the region from which the dielectric is to be removed after completion of the high density interconnect fabrication process, and, after such fabrication, cutting the dielectric layers and removing the piece of polytetrafluoroethylene.

SUMMARY OF INVENTION

It would desirable to provide a fabrication method for an electronic package with an open window over the device active area and with high pin count interconnections.

Briefly, in accordance with one embodiment of the present invention, a method for forming an interconnect structure comprises: applying a first metallization pattern on a dielectric layer, the first metallization pattern including at least one etch stop having a perimeter defining at least one etch stop opening; using an adhesive to attach a protective cover sheet over the first metallization pattern and the dielectric layer; aligning at least one mask opening with the at least one etch stop opening; removing a first portion of the adhesive through the at least one mask opening; removing the cover sheet; using a second portion of the adhesive to attach at least one electrical device such that an active area of the at least one electrical device is aligned with the etch stop perimeter; and curing the second portion of the adhesive.

In accordance with another embodiment of the present invention, an interconnection structure comprises: a dielectric layer; a first metallization pattern on the dielectric layer, the first metallization pattern including at least one etch stop having a perimeter defining at least one etch stop opening; a cured adhesive on a portion of the dielectric layer, the adhesive not present in an area aligned with the at least one etch stop; and at least one electrical device being attached to the dielectric layer by the adhesive such that an active area of the at least one electrical device is aligned with the etch stop perimeter.

In accordance with another embodiment of the present invention, a probe comprises: at least one energy-oriented probe electrical device including an active area and at least two device pads; a dielectric layer having an opening aligned with the active area of the electrical device; an adhesive coupling the dielectric layer and a non-active area of the device; at least two vias extending through the dielectric layer to the at least two device pads; and a metallization pattern extending into the at least two vias to contact the at least two device pads to couple the electrical device pads to probe equipment.

In accordance with another embodiment of the present invention, a method for fabricating an interconnection structure comprises: applying an adhesive over a dielectric layer; curing a first portion of the adhesive through at least one mask opening; using a second portion of the adhesive to attach at least one electrical device such that an active area of the at least one electrical device is aligned with the first portion of the adhesive; and curing the second portion of the adhesive.

In accordance with another embodiment of the present invention, an interconnection structure comprises: a dielectric layer; a first portion of cured adhesive; a second portion of cured adhesive; at least one electrical device being attached to the dielectric layer by the second portion of cured adhesive such that an active area of the at least one electrical device is aligned with the at least one predetermined area defined by the first portion of cured adhesive, the first portion of the cured adhesive being adhesively attached to the dielectric layer and not adhesively attached to the at least one electrical device.

BRIEF DESCRIPTION OF DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF THE INVENTION

Figure 1:
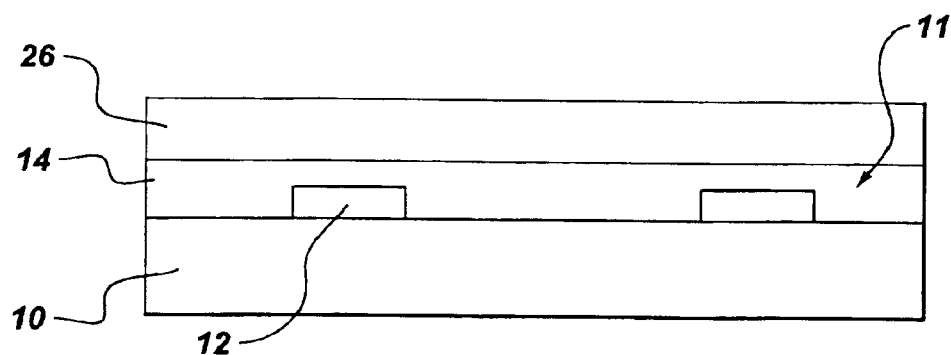
FIGS. 1 and 2 are sectional side and top views of a dielectric layer, a metallization pattern, an adhesive, and a cover sheet for use in accordance with one embodiment of the present invention.
Figure 2:
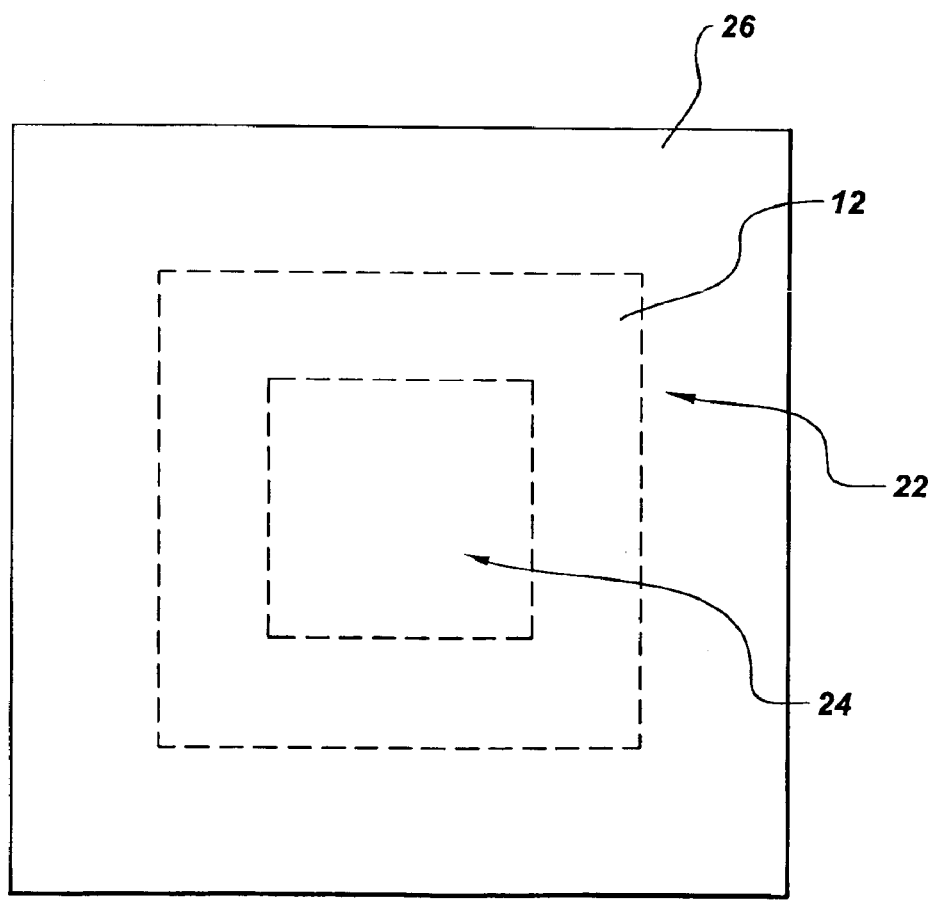
Figure 6:
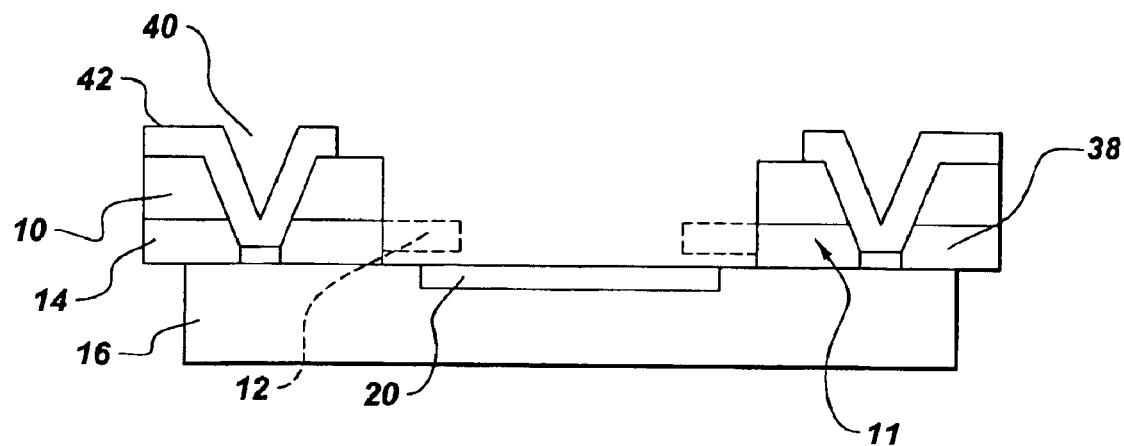
Figure 7:
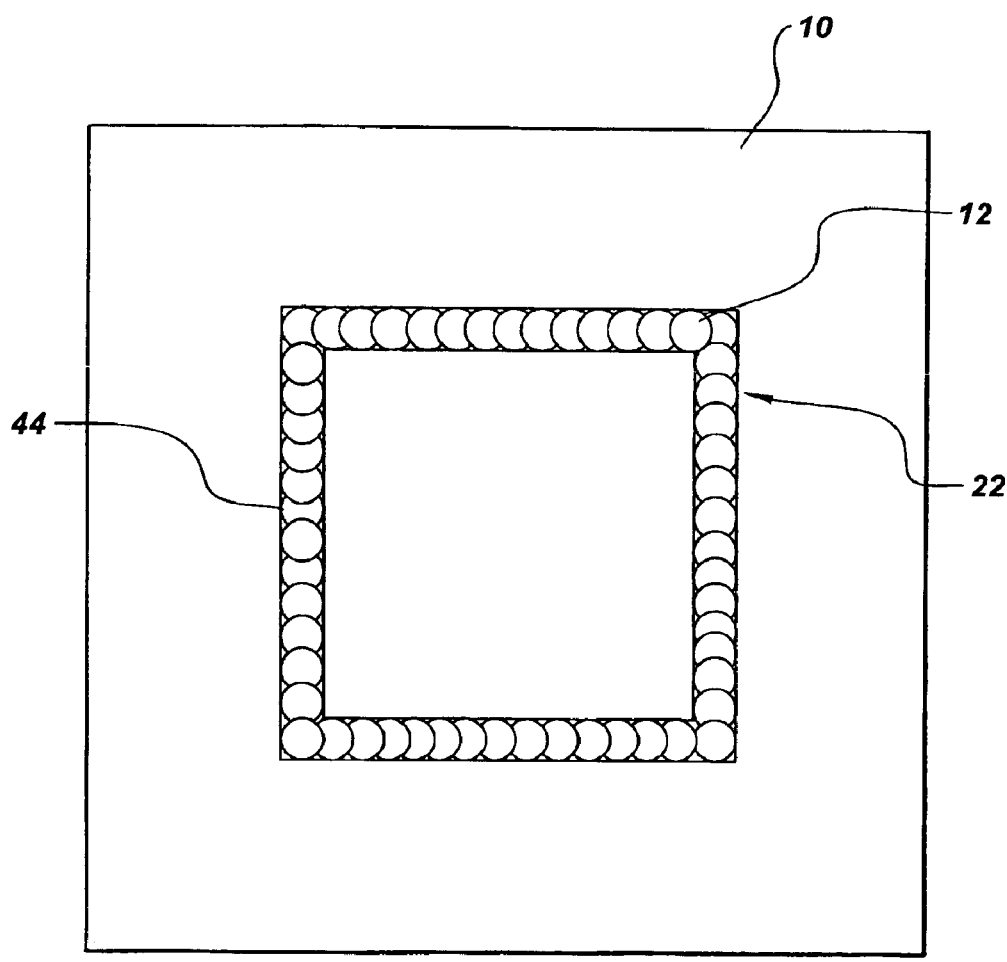
FIG. 7 is a partial top view illustrating one embodiment for use in obtaining the embodiment of FIG. 6.

FIGS. 1 and 2 are sectional side and top views of a dielectric layer 10, (FIG. 1) a metallization pattern 11, (FIG. 1) an adhesive 14, (FIG. 1) and a cover sheet 26 for use in accordance with one embodiment of the present invention; FIGS. 3–6 are sectional side views of further processing stages in accordance with the embodiment of FIG. 1; and FIG. 7 is a partial top view illustrating one embodiment for use in obtaining the embodiment of FIG. 6.

Briefly, in one example embodiment, an interconnection method comprises: applying a first metallization pattern 11 on a dielectric layer 10, the first metallization pattern including at least one etch stop 12 (FIG. 1,2) having a perimeter 22 (FIG. 1) defining at least one etch stop opening 24 (FIGS. 1); using an adhesive 14 to attach a protective cover sheet 26 over the first metallization pattern and the dielectric layer (FIG. 1); aligning at least one mask opening 30 with the at least one etch stop opening (FIG. 3); removing a first portion 36 of the adhesive through the at least one mask opening (FIGS. 3–4); removing the cover sheet (FIG. 4); using a second portion 38 of the adhesive to attach at least one electrical device 16 such that an active area 20 of the at least one electrical device is aligned with the etch stop perimeter (FIG. 4); and curing the second portion of the adhesive. The embodiment may further comprise forming at least two vias 40 through the dielectric layer to at least two device pads 18 (FIG. 4) of the at least one electrical device (FIG. 5); applying a second metallization pattern 42 (FIG. 5), the second metallization pattern extending into the at least two vias to contact the at least two device pads (FIG. 5); and removing the dielectric layer over at least a portion of the active area of the at least one electrical device (FIGS. 6–7).

Turning more specifically to FIGS. 1 and 2, in one embodiment, dielectric layer 10 comprises a polymer such as a polyimide, for example, and has a thickness ranging from about 10 micrometers ($\mu$m) to about 50 $\mu$m, for example. Preferably dielectric layer 10 is maintained in a substantially planar condition by being attached to or stretched over a metal frame (not shown), for example.

Next a first metallization pattern 11 is applied over dielectric layer 10. At a minimum, first metallization pattern 11 includes the at least one etch stop 12 having the perimeter 22 defining the at least one opening 24. First metallization pattern 11 may optionally further include electrical interconnection patterns (not shown). Metallization pattern 11 may include uniform metallization materials or different metallization materials. For etch stops, a useful metallization is copper with a thickness ranging from about 2 $\mu$m to about 6 $\mu$m, for example. For electrical interconnections, a useful metallization, for example, is about 1000 angstroms of titanium, covered by about 4 $\mu$m to about 18 $\mu$m of copper, which in turn is covered by about 1000 angstroms of titanium.

When using adhesive 14 to attach protective cover sheet 26 over first metallization pattern 11 and dielectric layer 10, it is useful to uniformly coat dielectric layer 10 and first metallization pattern 11 with adhesive 14 prior to applying cover sheet 26. In one embodiment, adhesive 14 comprises a polymeric adhesive, and cover sheet 26 comprises a polyimide having a thickness ranging from about 12 $\mu$m to about 25 $\mu$m, for example.

Figure 3:
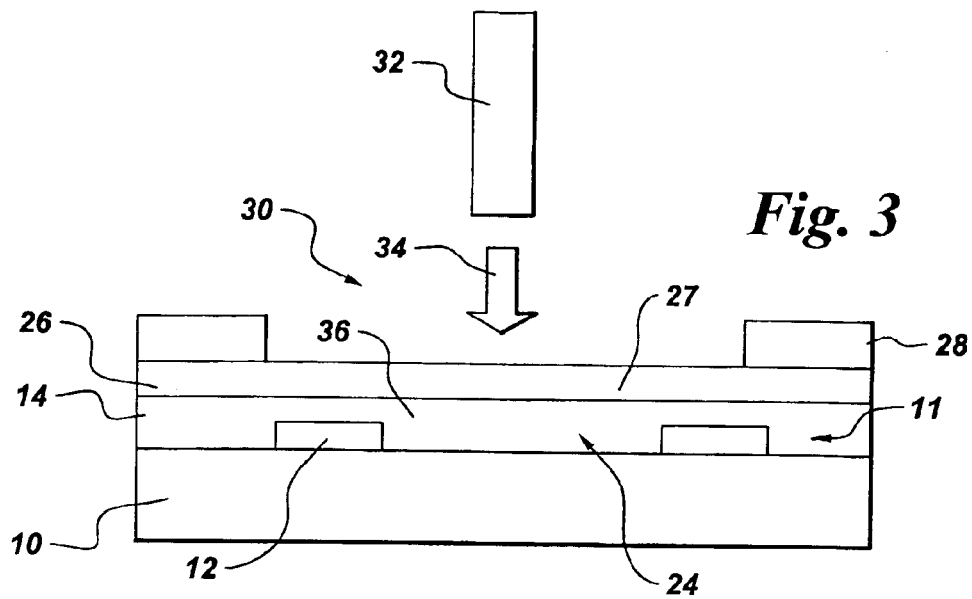
FIGS. 3–6 are sectional side views of further processing stages in accordance with the embodiment of FIG. 1.

FIG. 3 illustrates one representation of aligning mask opening 30 with opening 24 of etch stop 12. Although in the example of FIG. 3, the alignment is such that the mask is situated on the outer edge of etch stop 12, the alignment can alternatively be such that the mask opening is situated outside the outer edge of the etch stop or partway across the etch stop. Whichever way the alignment is performed, the alignment is preferably such that the later removal of adhesive results in a sufficiently large opening in the adhesive such that active area 20 of electrical device 16 (FIG. 4) will be substantially free of adhesive when attached to dielectric layer 10. Mask 28 may comprise a metal such as KOVAR™ alloyed metal (KOVAR is a trademark of CRS Holdings Inc. for an alloy typically comprising iron, nickel, and cobalt), for example. Mask 28 is preferably positioned in direct contact with cover sheet 26 to prevent soot or other contaminants from collecting between the mask and the cover sheet. Mask 28 is preferably held in position by placing a polished steel plate (not shown) beneath dielectric layer 10 and positioning clamping devices (not shown) such as magnets over the mask.

In one embodiment, the removing of first portion 36 of the adhesive through mask opening 30 comprises exposing cover sheet 26 and first portion 36 of the adhesive to light 34 from a light source 32. In this embodiment a portion 27 of cover sheet 26 is removed along with first portion 36 of adhesive 14. In a more specific embodiment, light 34 comprises actinic light 34 generated by a light source comprising an excimer laser operating at 248 nm, for example. In this embodiment, the exposure intensity and time are selected to be sufficient to remove both first portion 36 of adhesive 14 and portion 27 of cover sheet 26 overlying first portion 36 of adhesive 14.

Figure 4:
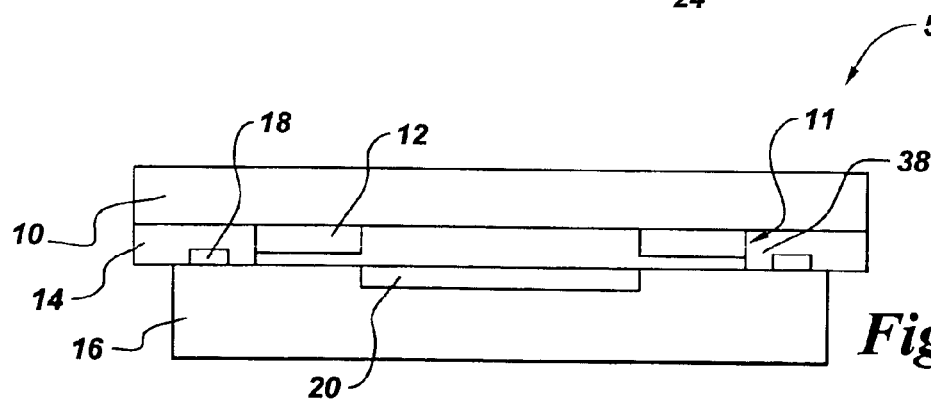

Next cover sheet 26 is removed (meaning, if a portion had been removed previously, the remainder of the cover sheet is removed, or, if no portion had been removed previously, the entire cover sheet is removed) and second portion 38 of adhesive 14 is used to attach at least one electrical device 16 such that an active area 20 of the at least one electrical device is aligned with the etch stop perimeter to result in the embodiment of FIG. 4. This stage of the processing can be performed either in the orientation shown (dielectric layer 10 above electrical device 16) or in an inverted orientation (not shown ). After the attachment, second portion 38 of adhesive 14 is cured. The present invention is particularly useful for electrical devices 16 having active areas 20 in need of substantially unobstructed paths for transmission and/or absorption of energy. Such energy-oriented electrical devices include, for example, ultrasound transducers and optical sensors or emitters. If desired, the embodiment of the interconnection structure 58 of FIG. 4 can be further processed below as described with respect to FIGS. 5–6.

Figure 5:
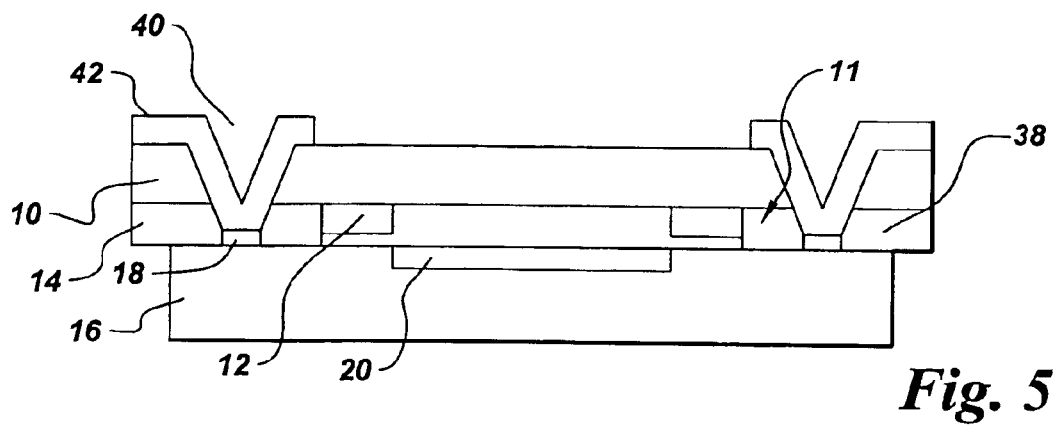

As shown in FIG. 5, least two vias 40 are formed through dielectric layer 10 (and any underlying second portion 38 of adhesive 14) to at least two device pads 18 of the at least one electrical device 16. The vias may be formed by conventional laser ablation techniques, for example. Next a second metallization pattern 42 is applied to extend into the vias to contact device pads 18. Second metallization pattern 42 may additionally provide interconnections to the electrical device, to other electrical devices, and/or to a connector (not shown) such as a connection plug, for example. Preferably, second metallization pattern 42 does not extend over etch stop 12.

One or more additional layers (not shown) of interconnections can be provided, if desired, by, for each additional layer, depositing a dielectric layer, forming appropriate vias extending to predetermined metallization or device pads, and applying a metallization pattern extending through the vias. Additionally or alternatively, an outer passivation layer (not shown) comprising a material such as a solder mask, for example, can be applied.

After second metallization pattern 42 and any optional additional layers or materials are applied, dielectric layer 10 is removed over at least a portion of the active area of the at least one electrical device to result in the embodiment of FIG. 6. In most embodiments, removing the dielectric layer over the entire active area will be advantageous, however, in some embodiments, dielectric layer 10 may be removed over less than entire active area. The localized removal of dielectric layer 10 can be done in any appropriate manner.

As shown in FIG. 7, in one embodiment, for example, the dielectric layer is removed by forming (preferably by laser ablation) a plurality of overlapping vias 44 in the dielectric layer along the etch stop perimeter and removing the resulting via-surrounded portion of the dielectric layer. The etch stop can be used in this embodiment to limit the depth of the vias and protect the underlying electrical device. If desired, the material and thickness of the etch stop can be selected to be such that the etch stop is vaporized or otherwise at least partially removed along with the dielectric layer. The inner portion of perimeter 22 (FIG. 7) of etch stop 12 is preferably selected to be situated outside the active area of the electrical device as a protective measure in case a via accidentally extends deeper than the etch stop.

In another embodiment, for example, the dielectric layer is removed by laser drilling through the dielectric layer along the perimeter of the at least one etch stop and removing the resulting surrounded portion of the dielectric layer. After overlapping vias are formed or laser drilling is performed, if the surrounded portion of the dielectric layer does not fall off automatically, a vacuum wand, for example can be used to lift the surrounded portion of the dielectric layer from the structure.

Figure 8:
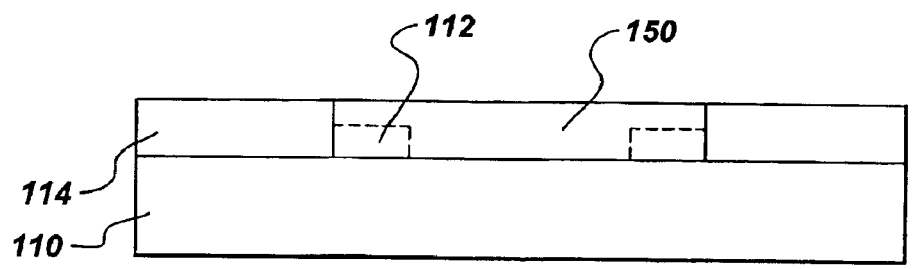
FIGS. 8 and 9 are sectional side and top views of a dielectric layer and an adhesive for use in accordance with another embodiment of the present invention.
Figure 9:
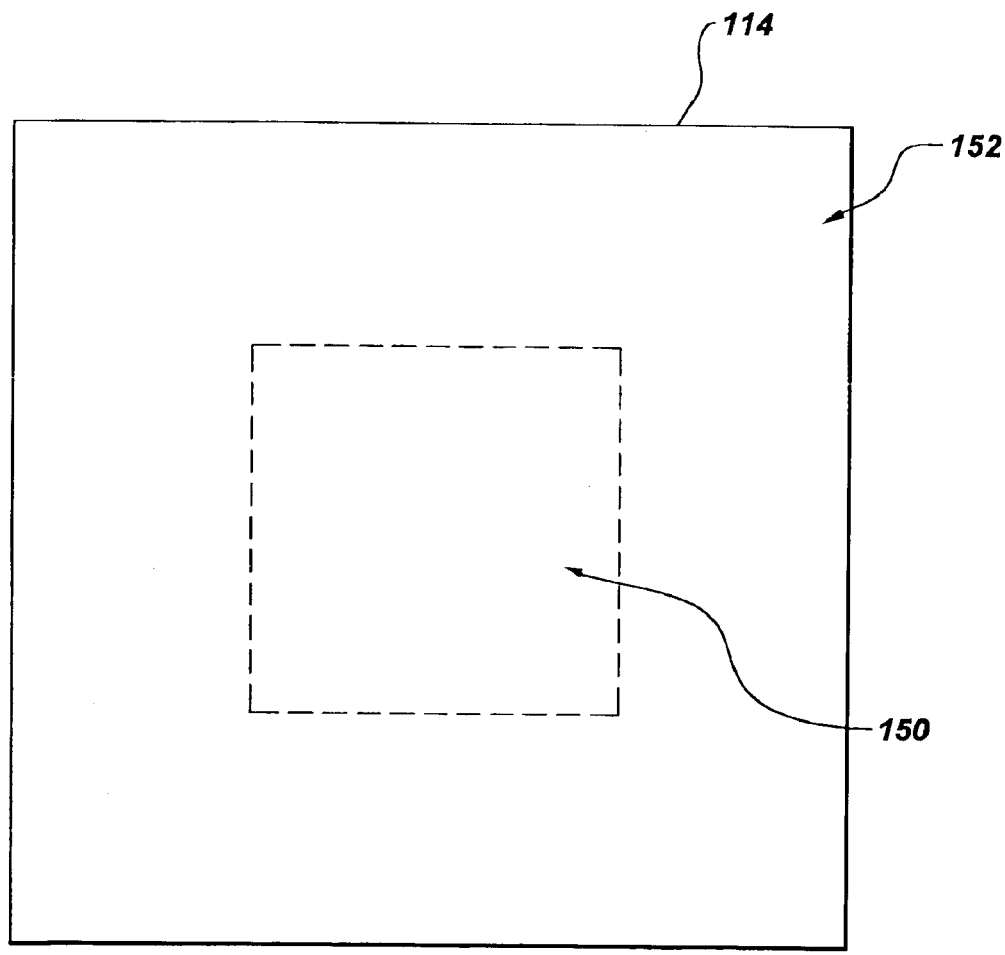
Figure 10:
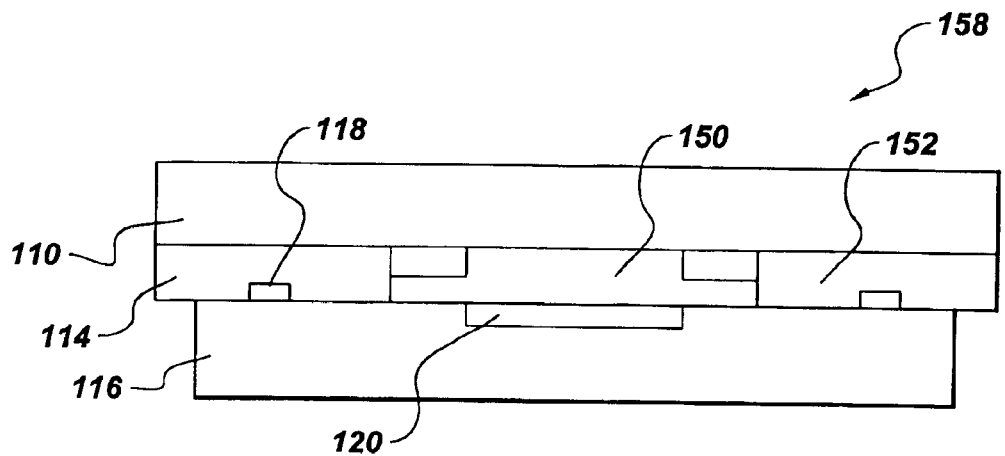
FIGS. 10–12 are sectional side views of further processing stages in accordance with the embodiment of FIG. 8.
Figure 11:
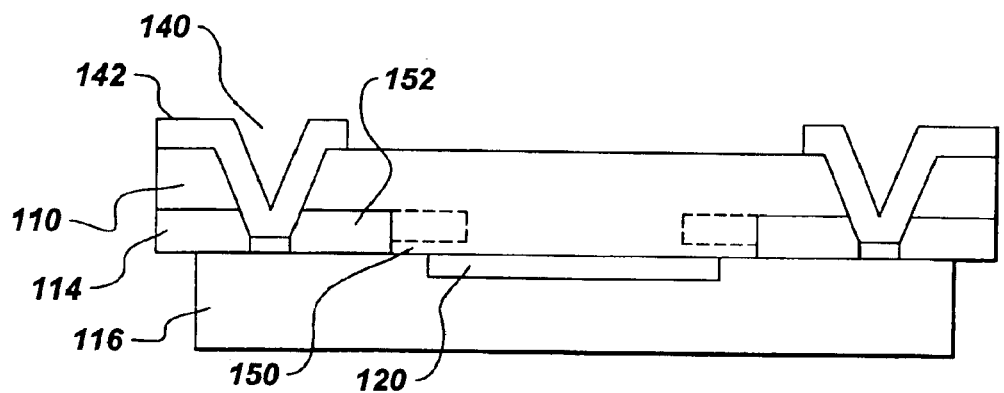
Figure 12:
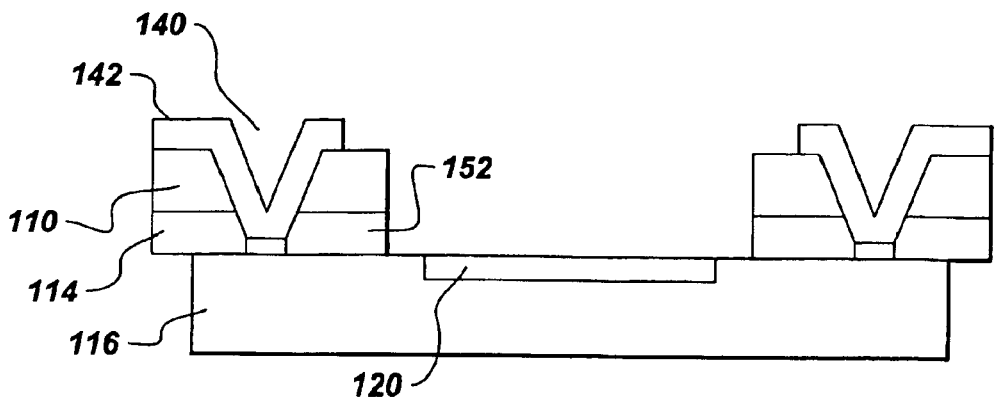

FIGS. 8 and 9 are sectional side and top views of a dielectric layer and an adhesive for use in accordance with another embodiment of the present invention; and FIGS. 10–12 are sectional side views of further processing stages in accordance with the embodiment of FIG. 8. The primary difference between these embodiments and the embodiments of FIGS. 1–7 is that the first portion of the adhesive is not removed prior to the attachment of the electrical device. Although a first metallization pattern including etch stops as described above with respect to FIGS. 1–7 is recommended for use in the embodiments of FIGS. 8–12 as a measure for protecting the electrical device, a first metallization pattern is not required.

Briefly, in one example embodiment, an interconnection method comprises: applying an adhesive 114 over a dielectric layer 110 (FIG. 8); curing a first portion 150 (FIGS. 8–9) of the adhesive through at least one mask opening; using a second portion 152 (FIG. 9) of the adhesive to attach at least one electrical device 116 (FIGS. 10–12) such that an active area 120 of the at least one electrical device is aligned with the first portion of the adhesive (FIG. 10); curing the second portion of the adhesive; forming at least two vias 140 through the dielectric layer to at least two device pads 118 of the at least one electrical device (FIG. 11); applying a metallization pattern 142, the metallization pattern extending into the at least two vias to contact the at least two device pads (FIG. 11); and removing the dielectric layer and the first portion of the adhesive over at least a portion of the active area of the at least one electrical device (FIG. 12).

Turning more specifically to FIGS. 8 and 9, in one embodiment, dielectric layer 110 corresponds to dielectric layer 10 (discussed with respect to FIGS. 1–2). First metallization pattern 11 (discussed with respect to FIGS. 1–2) can optimally be over dielectric layer 10 with etch stop(s) 112 (shown by dashed lines) in FIG. 8 and/or electrical interconnection patterns. In one embodiment, adhesive 114 comprises a polymeric adhesive.

A first portion 150 of adhesive 114 is cured through at least one mask opening (not shown in FIG. 8). The mask opening can be oriented such as discussed with respect to mask opening 28 of FIG. 3 and etch stop perimeter 22 of FIG. 7. In other words, first portion 150 of adhesive 114 is preferably chosen to result in a sufficiently large area such that active area 120 of electrical device 116 (FIG. 11) will be substantially free of un-cured adhesive when attached to dielectric layer 110. To prevent the mask from adhering to the adhesive, the mask is preferably not in direct contact with the adhesive.

In one embodiment, the curing of first portion 150 of adhesive 114 through a mask opening comprises exposing the first portion of the adhesive to light. The light source and type of light can be similar to those discussed with respect to FIG. 3. However, in the embodiment of FIGS. 8–12, the exposure intensity and time are selected to be sufficient to cure first portion 150 of adhesive 114 but not to completely or substantially remove it. In embodiments including etch stops 112, each etch stop 112 preferably has a perimeter defining at least one etch stop opening aligned with first portion 150 of adhesive 114.

Next second portion 152 of adhesive 114 is used to attach at least one electrical device 116 such that an active area 120 of the at least one electrical device is aligned with the first portion of the adhesive to result in an interconnection structure 158 of the embodiment of FIG. 10 wherein first portion 150 of the cured adhesive is adhesively attached to the dielectric layer but not adhesively attached to the at least one electrical device 116. As discussed with respect to FIG. 4, this stage of the processing can be performed either in the orientation shown or in an inverted orientation. After the attachment, second portion 152 of adhesive 114 is cured.

FIG. 11 is analogous to FIG. 6 with at least two vias 140 being formed through dielectric layer 110 (and any underlying second portion 150 of adhesive 114) to at least two device pads 118 of the at least one electrical device 116, and a metallization pattern 142 being applied to extend into the vias to contact device pads 118, to optionally provide interconnections, and to preferably not extend over active area 120 of electrical device 116. Again, one or more additional layers (not shown) of interconnections and/or a passivation layer (not shown) can be provided.

After metallization pattern 142 and any optional additional layers or materials are applied, and dielectric layer 110 is removed over at least a portion of the active area of the at least one electrical device to result in the embodiment of FIG. 12. The localized removal of dielectric layer 110 can be done in any appropriate manner.

For example, in a similar manner as described with respect to FIG. 7, in one embodiment, the dielectric layer is removed by forming a plurality of overlapping vias 44 or by laser drilling through the dielectric layer along a path. If no etch stop is present, first portion 150 of adhesive 114 can be used to limit the depth of the vias and protect the underlying electrical device. Preferably an etch stop is used to provide maximum protection of the electrical device. If desired, the material and thickness of the cured adhesive can be selected to be such that the cured adhesive in the vicinity of the vias or laser drilled path is vaporized or otherwise at least partially removed along with the dielectric layer.

Figure 13:
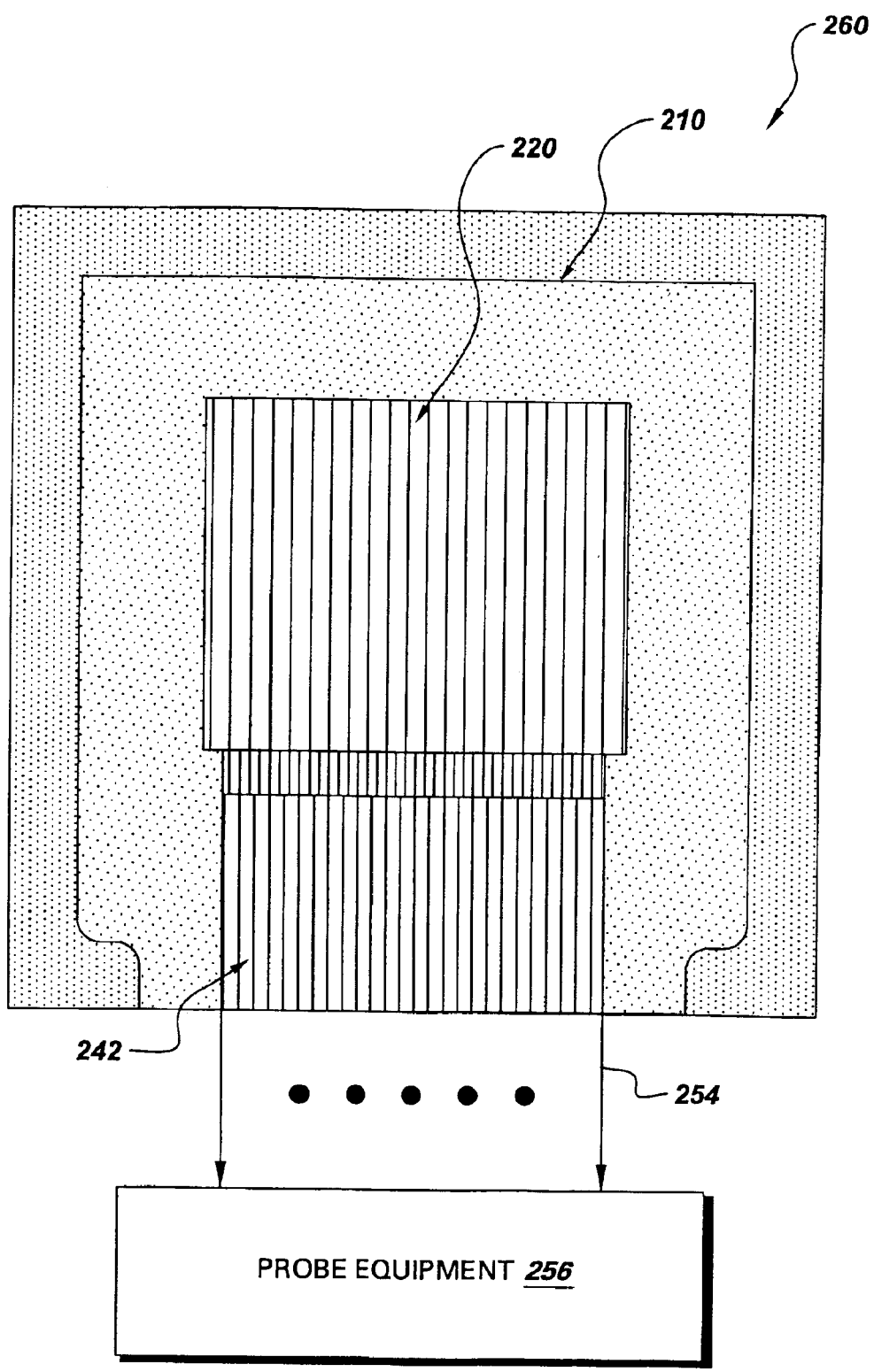
FIG. 13 is a top schematic and block view of a probe in accordance with one embodiment of the present invention.

By using any one of a number of the embodiments of the present invention, an electronic package can be fabricated with an open window over the device active area and with high pin count interconnections. For example, FIG. 13 is a top schematic and block view of a probe 260 in accordance with one embodiment of the present invention which may be fabricated by using the embodiment of FIGS. 1–7 and/or the embodiment of FIGS. 8–12. Probe 260 comprises: at least one energy-oriented probe electrical device (such as device 16 of FIG. 4); including an active area 220 and at least two device pads (such as device pads 18 of FIG. 4); a dielectric layer 210 having an opening aligned with the active area of the electrical device; an adhesive (such as second portion 38 of adhesive 14 of FIG. 4) coupling the dielectric layer and a non-active area of the device; at least two vias (such as vias 40 of FIG. 4) extending through the dielectric layer to the at least two device pads; and a metallization pattern 242 extending into the at least two vias to contact the at least two device pads to couple the electrical device pads to probe equipment 256.

Probe equipment 256 may comprise for example, computer equipment, medical equipment, or even equipment serving to couple metallization pattern 242 to other equipment. If desired, probe interconnections 254 can be used to provide the coupling of metallization pattern 242 and probe equipment 256.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. An interconnection structure comprising:
   a dielectric layer;
   a first metallization pattern on the dielectric layer, the first metallization pattern including at least one etch stop having a perimeter defining at least one etch stop opening;
   a cured adhesive on a portion of the dielectric layer, the adhesive not present in an area aligned with the at least one etch stop;
   at least one electrical device being attached to the dielectric layer by the adhesive such that an active area of the at least one electrical device is aligned with the etch stop perimeter.

2. An interconnection structure comprising:
   a dielectric layer;
   a first portion of cured adhesive;
   a second portion of cured adhesive;
   at least one electrical device being attached to the dielectric layer by the second portion of cured adhesive such that an active area of at least one electrical device is aligned with the at least one predetermined area defined by the first portion of cured adhesive, the first portion of the cured adhesive being adhesively attached to the dielectric layer and not adhesively attached to the at least one electrical device.

3. The interconnection structure of claim 2 further including a metallization pattern on the dielectric layer, the metallization pattern including at least one etch stop having a perimeter defining at least one etch stop opening aligned with the first portion of cured adhesive.

4. The interconnection structure of claim 2 wherein the interconnection structure comprises a probe and further includes
   at least two vias extending through the dielectric layer to at least two device pads of the at least one electrical device; and
   a metallization pattern extending into the at least two vias to contact the at least two device pads to couple the electrical device pads to probe equipment.

* * * * *